United States Patent [19]

Yonehara

[11] Patent Number: 5,312,771
[45] Date of Patent: May 17, 1994

[54] OPTICAL ANNEALING METHOD FOR SEMICONDUCTOR LAYER AND METHOD FOR PRODUCING SEMICONDUCTOR DEVICE EMPLOYING THE SAME SEMICONDUCTOR LAYER

[75] Inventor: Takao Yonehara, Atsugi, Japan
[73] Assignee: Canon Kabushiki Kaisha, Tokyo, Japan
[21] Appl. No.: 44,100
[22] Filed: Apr. 6, 1993

Related U.S. Application Data

[63] Continuation of Ser. No. 673,516, Mar. 22, 1991, abandoned.

[30] Foreign Application Priority Data

Mar. 24, 1990 [JP] Japan .................... 2-74210

[51] Int. Cl.⁵ .................... H01L 21/326; H01L 21/306
[52] U.S. Cl. .................... 437/174; 148/DIG. 4
[58] Field of Search .................... 437/173, 174; 148/DIG. 4, DIG. 80

[56] References Cited

U.S. PATENT DOCUMENTS

| | | | |
|---|---|---|---|
| 4,448,632 | 5/1984 | Akasaka | 156/603 |
| 4,576,652 | 3/1986 | Hovel et al. | 437/174 |
| 4,661,167 | 4/1987 | Kusumoki et al. | 437/174 |
| 4,727,044 | 2/1988 | Yamazaki | 437/45 |
| 4,855,014 | 8/1989 | Kakimoto et al. | 156/DIG. 73 |
| 5,021,119 | 6/1991 | Fan et al. | 156/DIG. 73 |

FOREIGN PATENT DOCUMENTS

| | | |
|---|---|---|
| 0225592 | 6/1987 | European Pat. Off. . |
| 0331811 | 9/1989 | European Pat. Off. . |
| 58-21368 | 2/1983 | Japan .................... 437/45 |
| 61-051874 | 3/1986 | Japan . |
| 61-63019 | 4/1986 | Japan .................... 437/173 |
| 61-65441 | 4/1986 | Japan .................... 437/173 |
| 61-289620 | 12/1986 | Japan . |
| 63-60519 | 3/1988 | Japan .................... 437/173 |
| 63-278323 | 11/1988 | Japan .................... 437/173 |
| 1-181473 | 7/1989 | Japan .................... 437/45 |
| 02162764 | 6/1990 | Japan .................... 437/173 |

OTHER PUBLICATIONS

T. Noguchi et al., "Polysilicon Super Thin Film Transistor Technology," *Materials Research Society Symposium Proceedings*, Polysilicon Films and Interfaces, vol. 106, 1988, pp. 292-305, no month.
Patent Abstracts of Japan, vol. 11, No. 20 (E-472) (2467) Jan. 20, 1987 & JP-A-61 190 918 (Fujitsu) Aug. 25, 1986.
R. Mukai et al., "Single crystalline Si islands on an amorphous insulating layer recrystallized by an indirect laser heating technique for three-dimensional integrated circuits," *Applied Physics Letters*, vol. 44, No. 10, May 1984, pp. 994–996.

*Primary Examiner*—George Fourson
*Assistant Examiner*—Richard A. Booth
*Attorney, Agent, or Firm*—Fitzpatrick, Cella, Harper & Scinto

[57] ABSTRACT

An optical annealing method for a semiconductor layer provided on a substrate comprises irradiating a base member provided with a semiconductor layer and an absorbing layer for incoherent light across an insulating layer, with incoherent light followed by patterning the absorbing layer to form a gate electrode.

8 Claims, 5 Drawing Sheets

OPTICAL ANNEALING METHOD FOR SEMICONDUCTOR LAYER AND METHOD FOR PRODUCING SEMICONDUCTOR DEVICE EMPLOYING THE SAME SEMICONDUCTOR LAYER

This application is a continuation in part of application Ser. No. 07/673,516 filed Mar. 22, 1991, now abandoned.

BACKGROUND OF THE INVENTION

1. Field of the Invention

The present invention relates to an optical annealing method for obtaining a semiconductor layer of high quality, and a method for producing a semiconductor device utilizing said semiconductor layer.

2. Related Background Art

In the field of crystal growing technology for growing a thin crystalline film on an amorphous substrate, there has been proposed a solid phase growing method consisting of heat treating an amorphous thin film, formed in advance on a substrate, at a temperature lower than the melting point, thereby transforming said film to a crystalline state.

For example, it was reported that large lamified polycrystals of the order of a micron could be formed by applying heat treatment to a thin silicon film, the film having been formed on an amorphous insulating substrate and having been made amorphous by ion implantation, for several tens of hours at 600° C. in a $N_2$ atmosphere. Transistors of satisfactory characteristics could be formed thereon (T. Noguchi, H. Hayashi & H. Oshima, 1987 Mat. Res. Soc. Symp. Proc., 106, Polysilicon and Interfaces, 293, Elsevier Science Publishing, New York, 1988).

Additionally, for improving the characteristics of the thin film and the device, methods of irradiation with an ultraviolet laser and with an infrared lamp have been proposed (T. Noguchi et al., Japanese Laid-Open Patent No. 61-289620) (Igano and Tani, Richo Technical Report No. 14, p. 4, Nov. 1985).

These two methods using lamp heating to deposit a thin Si film on a quartz substrate superpose so that a Si wafer in contact with said Si film. This causes said Si wafer to absorb the light of the lamp transmitted by said quartz substrate and said thin Si film, and to heat said thin Si film on said quartz substrate by conduction of the generated heat. These methods have the drawbacks of insufficient or uneven contact in microscopic scale, contamination, fusing etc. resulting from the superposing of a heat absorbing member.

For example, it is well known that the silicon wafer has modulations of several microns, even in the smoothest state. It is, therefore, impossible to obtain complete contact by superposing said Si wafer on the thin Si film so that the heat received by said thin Si film is inevitably uneven. As a result, the heated thin Si film generates an uneven temperature distribution therein, and such unevenness in temperature becomes an obstacle in obtaining a uniform structure in the crystal, and eventually affects the characteristics of the device in an undesirable manner. Further, if the temperature is raised close to the melting point, fusion of the thin Si film and the Si wafer serving to absorb the irradiating light may result, so that the device manufacturing process cannot be initiated.

SUMMARY OF THE INVENTION

An object of the present invention is to provide an optical annealing method free from the aforementioned drawbacks of the conventional methods and capable of applying a uniform heat treatment over a wide area, thereby obtaining a semiconductor layer with uniform semiconductive characteristics.

Another object of the present invention is to provide a method for forming a semiconductor layer with uniform semiconductive characteristics over a wide area and forming a semiconductor device utilizing said semiconductor layer.

Still another object of the present invention is to provide an optical annealing method for a semiconductor layer provided on a substrate, characterized by irradiating a substrate, provided with an absorbing layer for incoherent light superposed with said semiconductor layer across an insulating layer, with incoherent light.

Still another object of the present invention is to provide a method for forming a semiconductor device having a functional area in a semiconductor layer provided on a substrate. This method is characterized by irradiating a semiconductor layer, superposed with an absorbing layer for incoherent light across an insulating layer, with incoherent light, and effecting a patterning process so as to form a functional area in at least a part of said semiconductor layer and an electrode in at least a part of said absorbing layer.

DETAILED DESCRIPTION OF THE PREFERRED EMBODIMENTS

Now the function and structure of the present invention will be explained in detail, together with the findings which have lead thereto.

Figure 1:
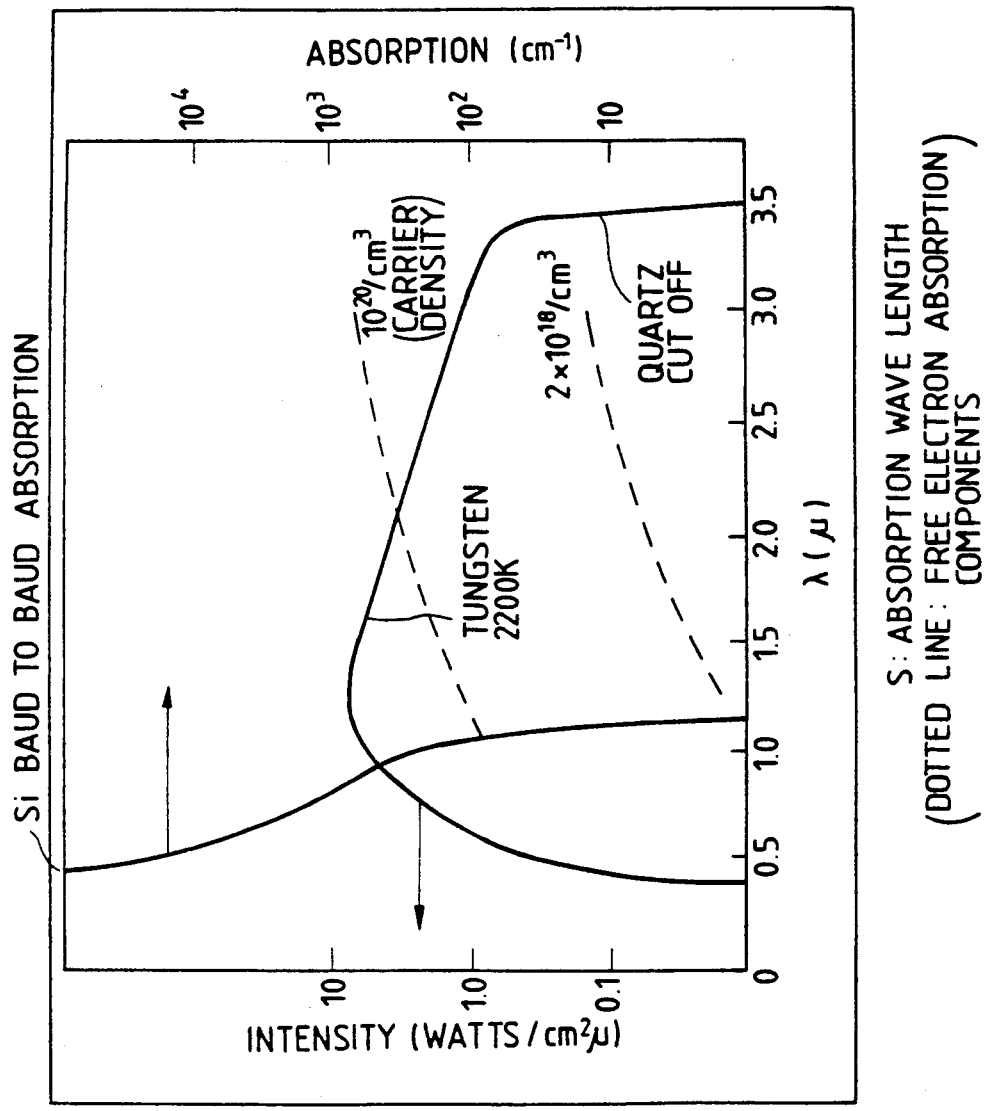
FIG. 1 is a chart showing the relation between the absorption coefficient of silicon and the wavelength of light.

FIG. 1 shows the relationship among the black body radiation spectrum of an ordinary tungsten halogen lamp (2200K), absorption coefficient of silicon and of free carriers therein, and wavelength of irradiating light.

As shown in FIG. 1, the absorption coefficient of silicon at the basic absorption end rapidly increases at a wavelength of 1.2 $\mu$m and shorter. On the other hand, the black body radiation spectrum of the tungsten halogen lamp at 2200K extends over a wide infrared range from 0.4 $\mu$m to 3.5 $\mu$m which is the cut-off wavelength of the quartz glass. Also, the absorption of free carriers extends to the longer wavelength side from 1.0 $\mu$m, and becomes stronger as the carrier display becomes higher.

The above-explained relationship clearly indicates the following three facts:

1) The quartz substrate can be insufficiently heated by infrared irradiation;

2) Si layer absorbs light of a wavelength region below about 1 μm, but such light constitutes only a very small portion of the light emitted by the lamp; and 3) An increase in the number of carriers in the Si layer increases the light absorption, thus allowing effective utilization of the light of the lamp.

In addition, the light absorption of a Si layer is dependent on the thickness thereof. The thickness of a Si layer, when used as a semiconductor layer for a transistor, preferably does not exceed 0.1 μm in consideration of electrical characteristics such as the leak current. However, a Si layer of thickness of the order of 0.1 μm formed on a quartz substrate barely absorbs a small amount of light but transmits a small portion of the light from the lamp.

Therefore, incoherent lamp light of an irradiation intensity capable of heating an Si wafer of a thickness of 7,5000 μm even to 1,200° C. can only heat an Si layer of a thickness of 0.1 μm on a light-transmitting quartz substrate to several hundred degrees.

On the other hand, it is already known that a metal layer has a higher light absorption than in the Si layer.

Figure 2:
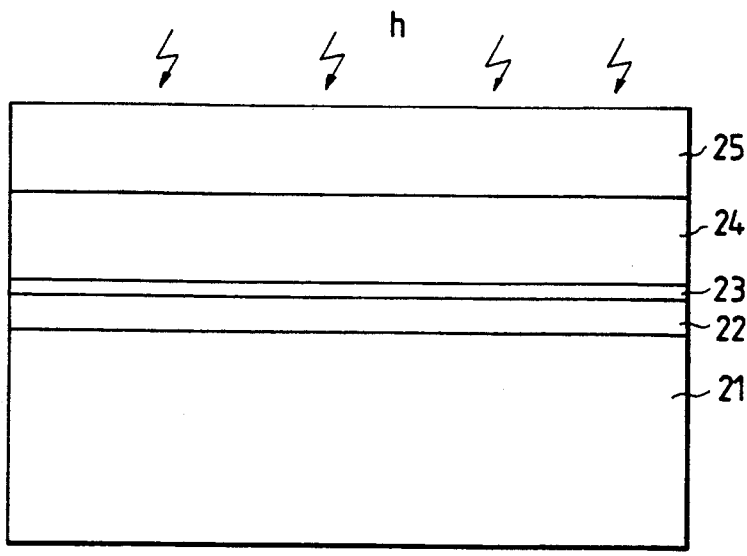
FIGS. 2 and 3 are schematic views for explaining the present invention.

According to the present invention, in order to achieve heating sufficient for annealing a thin Si layer provided on a light-transmitting substrate, a light-absorbing layer is deposited on said Si layer, across an insulating layer, as indicated by a basic structure shown in FIG. 2.

As shown in FIG. 2, on a light-transmitting substrate 21, for example, of quartz, there are provided in succession: a semiconductor layer 22, for example, of silicon, an insulating layer 23, a light-absorbing layer 24, and a protective layer 25.

For forming a base member of the layer structure shown in FIG. 2, a semiconductor layer 22 for example of Si, SiGe, GaAs or InP is initially formed by an ordinary film depositing method, on a light-transmitting substrate.

For forming a thin film electronic device utilizing the semiconductor layer annealed according to the present invention, the thickness of the semiconductor layer 2 is preferably in a range from 0.05 to 0.3 μm, more preferably from 0.06 to 0.2 μm.

Subsequently an insulating layer 23, serving as a separating layer, is formed by an ordinary film depositing method. Said insulating layer 23 can be composed, for example, of silicon oxide, silicon nitride, $SiO_xN_y$ or tantalum oxide.

For the purpose of separating the semiconductor layer 22 and the light-absorbing layer 24 and being used as a part of the structural components of the electronic device, said insulating layer 23 has a thickness preferably in a range from 0.05 to 1 μm, more preferably from 0.05 to 0.5 μm, and most preferably from 0.05 to 0.1 μm.

A light-absorbing layer 24 is formed on said insulating layer 23. Said light-absorbing layer 24 is composed, for example, of polycrystalline Si, amorphous Si, polycrystalline SiGe etc. Also there may be employed a doped semiconductor material with increased absorption by the presence of free carriers, such as P-doped amorphous Si, B-doped amorphous Si or As-doped amorphous Si.

For example, a polycrystalline Si layer of a thickness of 0.5 μm doped with P at a concentration of $10^{20}/cm^3$ is heated to 100° C. higher than the undoped layer under the same light irradiating condition. Also the light-absorbing layer 24 may be conveniently composed of a metal, such as W (tungsten), Mo (molybdenum), WSi (tungsten silicide) or MoSi (molybdenum silicide).

A protective layer 25 may be provided for preventing the surface coarseness or evaporation of the light-absorbing layer 24, appearing under a high light intensity. Said protective layer 25 may be composed of a light-transmitting material capable of withstanding a high temperature, such as $SiO_2$, $Si_3N_4$ or a $SiO_2/Si_3N_4$ bilayer structure.

Figure 3:
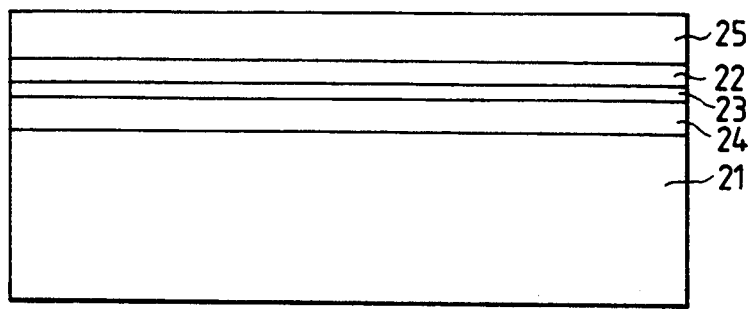

When the above-explained multi-layered structure is irradiated with the light of a lamp from above, said light is transmitted by the protective layer 25 and is absorbed by the absorbing layer 24 thereby elevating the temperature thereof. As a result, the semiconductor layer 22 of a thickness insufficient for direct heating by light absorption can be sufficiently heated by conduction through the separating layer 24. Also, in case the light irradiation is conducted from below, the light of the lamp is transmitted by the quartz substrate 21, as well as by the semiconductor layer 22 and the separating layer 23, and absorbed by the light-absorbing layer 24 thereby elevating the temperature thereof. The heating effect for the light-absorbing layer 24 is enhanced by light irradiations from above and below. Further, the absorbing layer 24 may be positioned between the semiconductor (active) layer 22 and the substrate 21 as shown in FIG. 3. It may also be provided at the rear face of the substrate 21 for leaving the temperature thereof, resulting in improved control and reduced strain.

For sufficiently absorbing the incident light and heating the semiconductor layer, the thickness of the light-absorbing layer is selected preferably in a range from 0.5 to 2 μm, more preferably from 0.5 to 1.5 μm and most preferably from 0.5 to 1 μm.

If the starting material for the semiconductor layer 22 is, for example, amorphous Si or polycrystalline Si with small grain-size, there will result a growth of grains to the order of a micron, with an improvement in the performance of the device due to a reduced influence of the grain boundaries. Also, if the aforementioned large-sized lamified polycrystals of the order of a micron are employed as the starting material for the semiconductor layer 22, a significant decrease in the twin crystal defects present at a high density in the semiconductor layer 22 is obtained.

Particularly if the annealing of the crystals by light irradiation is conducted at a high temperature from 1,000° C. to 1,420° C., there can be achieved efficient elimination of lamination defects and transitions within the semiconductor layer 22.

The heating of the thin Si film, formed on a light-transmitting substrate, can be enhanced with improved control and uniformity, by forming a semiconductive or metallic light-absorbing layer by deposition on or under said Si film across an insulating layer, or forming both such light-absorbing layers on and under said Si film respectively across insulating layers, thereby securing satisfactory adhesion between the light-absorbing layer(s) and the Si film, and giving a light irradiation thereto.

Also, the process for producing the semiconductor device can be simplified by utilizing said light-absorbing layer as a part of the structure of said device.

Also the use of incoherent light prevents unevenness in the thermal treatment temperature resulting from the light interference during irradiation, thereby achieving uniform heat treatment over the entire film.

For achieving collective heat treatment of a large area within a short time, the intensity of light irradiation is preferably selected within a range from 0.1 to 300 W/cm$^2$, more preferably from 10 to 150 W/cm$^2$.

Further, to obtain a semiconductor layer of a high quality, the heat treatment of the semiconductor layer by light irradiation is preferably conducted within a temperature range from 1,200° C. to 1,400° C., more preferably from 1,250° C. to 1,400° C. and most preferably from 1,300° C. to 1,380° C.

Figure 4:
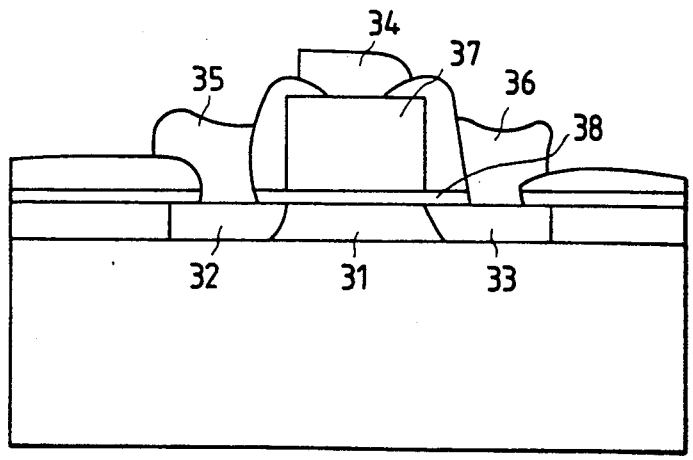
FIGS. 4–7 show the steps of forming a field effect transistor according to Example 1.

A case of utilizing the Si film with the above-explained multi-layered structure in a field effect transistor will now be explained. In an ordinary semiconductor process, the semiconductor layer 22 is used as a channel 31, the separating layer 23 as a gate insulating layer 38, and the light-absorbing layer 24 as a gate electrode layer 37, as shown in FIG. 4. Highly doped source 32 and drain 33 shown in FIG. 4 may be formed by forming apertures in the separating layer 23 shown in FIG. 2, corresponding to the areas of said source 32 and drain 33, utilizing doped polycrystalline Si as the light-absorbing layer 24 and effecting thermal diffusion at the heating with the light of a lamp, or by effecting ion implantation in said apertures by an ordinary semiconductor process.

For electrical contact with said source 32, drain 33 and gate electrode layer 37, there are formed a gate electrode 34, a source electrode 35 and a drain electrode 36 of a conductive material such as aluminum. The thin film field effect transistor thus formed exhibits improved characteristics resulting from the heating temperature by the lamp.

In the following there will be explained examples of the present invention for the purpose of further clarification, but it is to be understood that the present invention is by no means limited in any way by such examples.

EXAMPLE 1

On a quartz glass plate 21 of a size of 10×10 cm and a thickness of 500 μm, a polycrystalline Si layer (active layer) 22 of a thickness of 0.1 μm, having a small average crystal size of about 500 Å, was formed by reduced pressure CVD, thermally decomposing SiH$_4$ under a pressure of 0.3 Torr and with a substrate temperature of 620° C.

Then, on said polycrystalline Si layer 22, an SiO$^2$ layer 23 of a thickness of 500 Å was formed by thermal CVD, introducing SiH$_4$ gas and O$_2$ gas under a pressure of 760 Torr and with a substrate temperature of 400° C.

Subsequently, on said SiO$_2$ layer 23, a polycrystalline Si layer of a thickness of 5,000 Å was formed by reduced pressure CVD, thermally decomposing SiH$_4$ gas under a pressure of 0.3 Torr and with a substrate temperature 620° C., and phosphor ions were implanted at a concentration of 10$^{20}$ ions/cm$^3$ to obtain a highly P-doped light-absorbing layer 24.

Further, a protective SiO$_2$ layer 25 of a thickness of 1 μm was formed thereon by thermal CVD, introducing SiH$_4$ gas and O$_2$ gas under a pressure of 760 Torr and with a substrate temperature of 400° C.

The obtained based member of the multilayered structure shown in FIG. 2, was irradiated with the light of tungsten halogen lamps from above and below for 3 minutes, with an intensity of 78 W/cm$^3$ in a N$_2$ atmosphere. The temperature, measured with an optical pyrometer on a substrate Si wafer provided as a temperature monitor, reached 1,380° C. after irradiation for 3 minutes.

The thermal energy generated by the irradiating light absorbed by the n$^+$polycrystalline Si layer 24 of a thickness of 0.5 μm was transferred by conduction through the SiO$_2$ layer 23 to the undoped polycrystalline Si layer 22 of a thickness of 0.1 μm, thus applying a heat treatment thereto and increasing the grain size several hundred times to the order of several microns.

The surface of the Si layer was not made coarse by the capping effect of the protective layer 25.

The obtained base member, thus annealed by the light irradiation explained above, was used in the preparation of a field effect transistor by an ordinary IC process.

In the following there will be explained the process for producing said field effect transistor, with reference to FIGS. 4 to 7.

Figure 5:
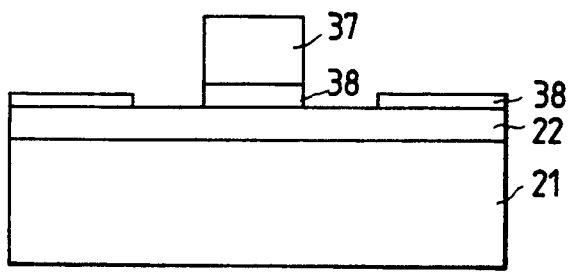

Initially, the protective layer 25 was removed by etching with buffered fluoric acid. Subsequently a gate area was formed by etching off the light-absorbing layer 24 except for the area of the gate electrode layer 37, forming a gate electrode layer, forming apertures in the separating layer 23 corresponding to the drain and source, and forming a gate insulating layer 38 (FIG. 5).

Figure 6:
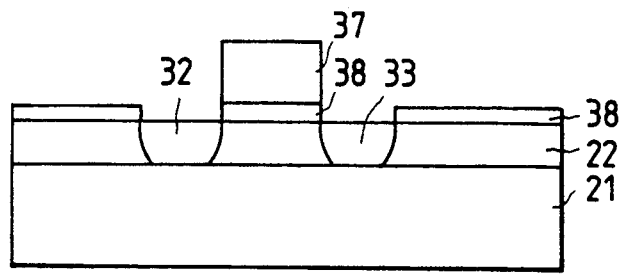

Then the source 32 and the drain 33 were formed by implanting P ions with a dose of 5×10$^{15}$ ions/cm$^2$ into the semiconductor layer 22 exposed in said apertures (FIG. 6).

Figure 7:
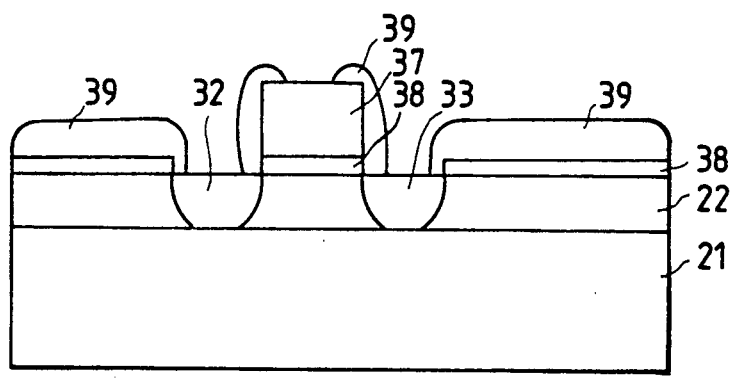

Subsequently a protective SiO$_2$ layer 39 of a thickness of 1 μm was formed by CVD, introducing SiH$_4$ gas and O$_2$ gas under a pressure of 760 Torr and with a substrate temperature of 400° C., and contact holes were formed for electrical contact with the gate electrode layer 37, source 32 and drain 33 (FIG. 7).

Then aluminum was deposited as the electrode material, and the gate electrode 34, source electrode 35 and drain electrode 36 were formed by patterning. Thus the field effect transistor was completed (FIG. 4).

The transistor thus formed showed satisfactory transistor characteristics with a carrier mobility at least equal to 100 cm$^2$/V.sec, a threshold value of about 1.5V, and a sub threshold characteristic of 300 mV/decade. Stated differently, the semiconductor layer 22 annealed according to the present example proved to have satisfactory electrical properties for use as a functional area of a semiconductor device.

Also, in the present example, the annealed base member is provided with a light absorbing layer 24 consisting of polycrystalline Si containing a large amount of phosphor atoms, a semiconductor layer 22 consisting of large-sized Si grains with excellent semiconductive characteristics, and a separating layer 23 consisting of an insulating material for separating said light absorbing layer 24 and semiconductor layer 22, so that source 32 and the drain 33 could be formed in said semiconductor layer 22, the gate insulating layer 38 in said separating layer 23, and the gate electrode layer 37 in said light absorbing layer 24 Thus, according to the present invention, after the annealing treatment for obtaining a semiconductor layer of a high quality, a semiconductor device can be produced with a fewer number of steps, excluding steps for forming an insulating layer for the gate insulating layer and a highly doped layer for the gate electrode layer.

EXAMPLE 2

Initially, on a quartz glass substrate 121 of a size of 10×10 cm and a thickness of 500 μm, an amorphous Si layer 122 of a thickness of 0.1 μm was formed by reduced pressure CVD employing SiH4 as the raw material gas under a pressure of 0.3 Torr and a substrate temperature of 550° C.

On said amorphous Si layer 122, a SiO2 separating layer 123 was then formed by CVD employing SiH4 gas and O2 gas under a pressure of 760 Torr and a substrate temperature of 400° C. In a sputtering apparatus, on said separating layer 123, there was formed a light absorbing layer 124 by sputtering tungsten to obtain a thickness of 5,000 Å under a pressure of 10 mTorr, with an ambient substrate temperature and in an argon atmosphere.

Subsequently, on said light absorbing tungsten layer 124, a first protective layer 125 of a thickness of 1 μm consisting of SiO2 was formed in the same manner as in the formation of said separating layer. A second protective layer 126 of a thickness of 500 Å consisting of Si3N4 was then formed by reduced pressure CVD employing SiH2Cl2 and NH3 as the raw material gasses under a pressure of 0.5 Torr and a substrate temperature of 800° C. Thus, a base member 101 with a two-layered protective layer 127 was completed (FIG. 8).

Figure 8:
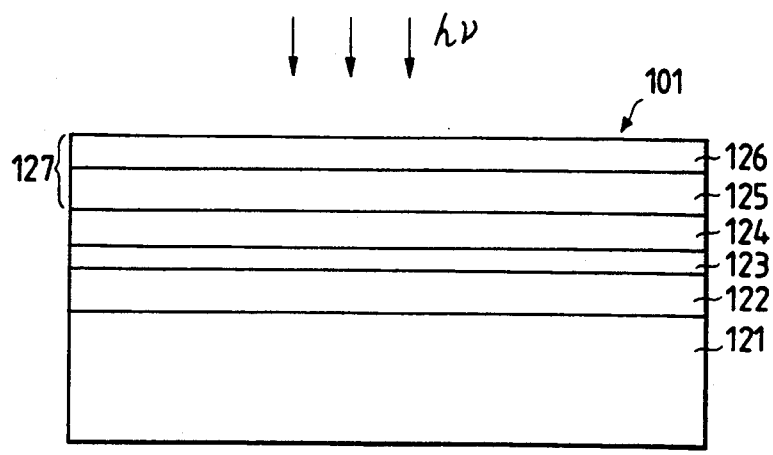
FIGS. 8–12 show the steps of forming a field effect transistor according to Example 2.

Said base member 101 was then irradiated with the light of a tungsten halogen lamp for 1 minute with an intensity of 60 W/cm$^2$ from above (direction of arrows h, shown in FIG. 8).

A silicon wafer separately provided for temperature monitoring reached 1,350° C. after light irradiation for 1 minute.

Said base member 101 subjected to annealing by light irradiation explained as above was subsequently used for the preparation of a field effect transistor in an ordinary IC process.

Figure 9:
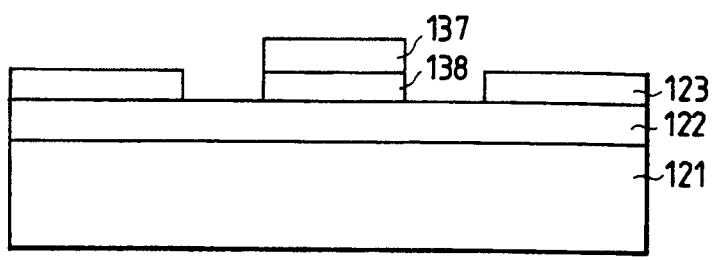

At first the protective layer 127 was removed with a phosphoric-fluoric acid mixture, and the light absorbing layer 124 was removed, except for a gate electrode area 137 by reactive ion etching. Then apertures were formed in the separating layer 123 so as to expose the areas for forming the source and drain, thereby forming a base member provided with a gate 137 and a gate insulating layer 138. (FIG. 9).

Figure 10:
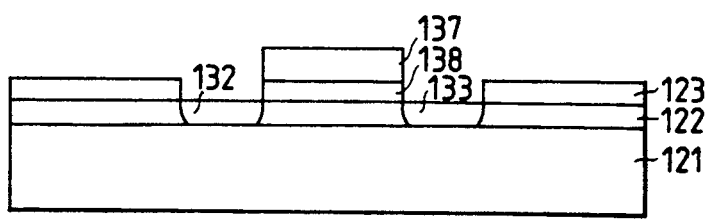

Subsequently P ions were implanted into said apertures with a dose of $4 \times 10^{15}$ ions/cm$^2$ to obtain a base member provided with a source 132 and a drain 133 (FIG. 10).

Figure 11:
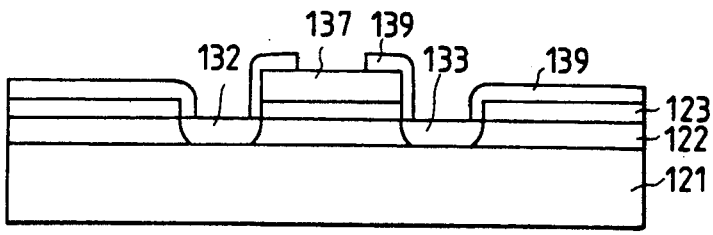

Then a protective layer 139 of a thickness of 1 μm was formed by CVD employing SiH4 gas and O2 gas under a pressure of 760 Torr and a substrate temperature of 400° C., and contact holes were formed to expose the source 132, drain 133 and gate 137 (FIG. 11).

Figure 12:
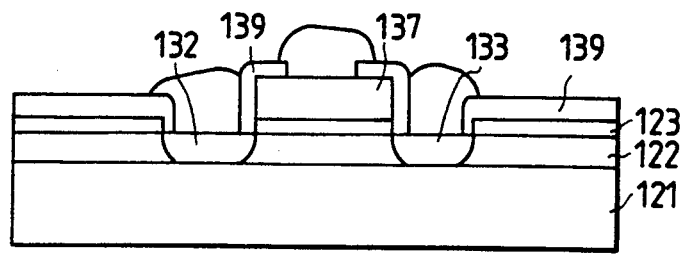

For making electrical contact with the source 132, drain 133 and gate 137, an aluminum electrode layer was formed with a thickness of 1 μm by sputtering under a pressure of 100 Torr and at room temperature, and was subsequently patterned to complete the field effect transistor shown in FIG. 12.

The field effect transistor thus obtained showed excellent characteristics in the measurement of the carrier mobility and the sub threshold characteristic.

Also in order to confirm the effect of the annealing of the present example, a field effect transistor was prepared in the identical manner except for the optical annealing of the present example, and was subjected to the measurement of the carrier mobility and the sub threshold characteristic (reference example).

The results of measurements of the transistors of the present example and of the reference example are summarized in Tab. 1.

TABLE 1

|  | Reference Example | Present Example |
| --- | --- | --- |
| Carrier Mobility (cm$^2$/V · sec) | 0.1 | 120 |
| Sub threshold characteristic (mV/decade) | 1,500 | 300 |

As will be clearly understood from Table 1, the transistor subjected to the optical annealing of the present example showed excellent transistor characteristics, with a high carrier mobility and a low sub threshold characteristic.

The silicon layer 122, when observed under a transmissive electron microscope, consisted of polycrystals with an average grain size as large as 10 microns.

Also in the present example, since the protective layer 127 had a two-layered structure consisting of a first SiO2 layer 125 and a second Si3N4 layer, the surface of Si layer was extremely smooth even after the processing and retained the smoothness at the initial deposition.

EXAMPLE 3

Figure 13:
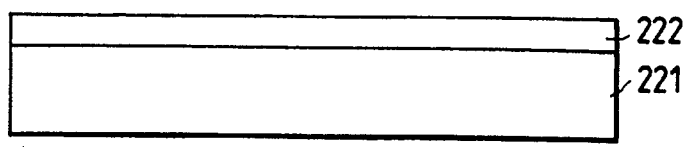
FIGS. 13 and 14 are schematic views for explaining the present invention.

On a quartz substrate 221 of 15×15 cm and a thickness of 500 μm, a polycrystalline Si layer 222 of a thickness of 0.1 μm was formed by reduced pressure CVD employing SiH4 as the raw material gas under a pressure of 0.3 Torr and with a substrate temperature of 620° C. Si+ions were implanted with an accelerating voltage of 50 keV at a concentration of $2 \times 10^{15}$ ions/cm$^2$ to transform said polycrystalline Si layer 222 into an amorphous state, thereby obtaining a base member with an amorphous Si layer 222 (FIG. 13).

Said base member was heat treated for 50 hours at 600° C. in a N2 atmosphere, thereby growing by solid phase growth, lamified crystals of large grain size reaching 5 microns at maximum, in said amorphous Si layer 222.

The base member with said lamified crystalline layer 222 was thermally oxidized at a thickness of 500 μ from the top surface in an oxidizing atmosphere, thereby forming in insulating SiO2 layer 223. The lamified crystalline layer 222 remaining unoxidized was transformed into a polycrystalline Si layer 224 having a thickness of about 500 Å.

On said insulating layer 223, a polycrystalline Si layer 225 having a thickness of 0.5 μm was formed by reducing pressure CVD employing SiH4 as the raw material gas under a pressure of 0.3 Torr and with a substrate temperature of 620° C., and light absorbing titanium layer 226 having a thickness of 0.1 μm was formed thereon by sputtering under a pressure of 20 m Torr and at an ambient substrate temperature.

Then, on said light absorbing layer 226, a protective SiO2 layer 227 with a thickness of 1.0 μm was formed by CVD employing SiH4 and O2 as the raw material gasses under a pressure of 760 Torr and with a substrate temperature of 400° C. On the rear side of the substrate 221, a polycrystalline Si layer 228 of a thickness of 0.6 μm was formed as a rear light absorbing layer.

Figure 14:
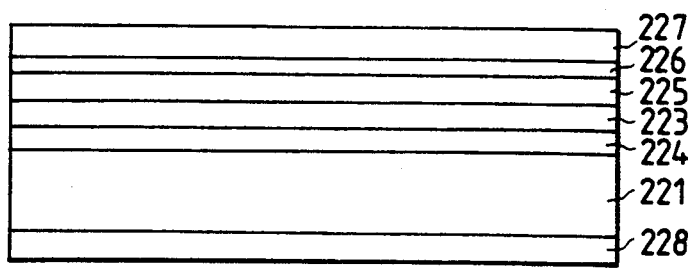

A base member shown in FIG. 14 was thus completed. Said base member was irradiated by the light of tungsten lamps with an intensity of 70 W/cm$^2$, for 3 minutes from both sides of the base member. A separate Si wafer, used as a temperature monitor, showed a temperature of 1,380° C. after light irradiation for 3 minutes.

Said light irradiation induced reaction between the light absorbing polycrystalline Si layer 225 and the Ti layer 226, thereby forming TiSi$_2$.

Further, the lamified polycrystalline layer 224 of large grain size reaching 5 microns at maximum contains transition groups in each grain prior to the optical annealing, but they almost disappeared after the annealing, and extremely good crystallinity could be obtained.

Said base member was utilized in the preparation of a field effect transistor in a similar manner as in the Example 1. The obtained field effect transistor showed excellent characteristics which were almost the same as those of a transistor formed on a monocrystalline silicon wafer.

EXAMPLE 4

On a quartz substrate (100mm$\phi$), an Si layer of a thickness of 0.1 $\mu$m was deposited by vacuum evaporation with a deposition rate of 1 Å/sec. under a pressure of $1 \times 10^{-8}$ Torr and with a substrate temperature of 200° C.

Said Si layer, deposited in amorphous state, was transformed into a large-sized lamified polycrystalline layer, similar to that shown in Example 3, by a heat treatment for 50 hours at 600° C. in an N$_2$ atmosphere.

Then, on said polycrystalline layer, a separating layer of Ta$_2$O$_5$ with a thickness of 500 Å was deposited by sputtering, and a light absorbing layer was formed by depositing polycrystalline Si, with P added at a concentration at least equal to 10$^{20}$ atoms/cm$^3$, to obtain a thickness of 0.5 $\mu$m. Subsequently, a protective SiO$_2$ layer having a thickness of 1.0 $\mu$m was deposited by CVD, thereby completing the base member.

Said base member was irradiated for 3 minutes from both sides with the light of tungsten halogen lamps of an intensity of 72 W/cm$^2$. A temperature monitoring wafer reaches a temperature of 1,345° C. after light irradiation for 3 minutes.

A field effect transistor was prepared in a similar manner as in Example 1, utilizing the light absorbing polycrystalline Si layer for the gate, and there were obtained satisfactory characteristics comparable to those of a field effect transistor prepared on a silicon wafer.

Observation under a transmissive electron microscope proved that the defects, present in the active layer close to the interface were significantly decreased.

EXAMPLE 5

On a quartz glass substrate (100 mm$\phi$), a polycrystalline Si layer (semiconductive layer) with fine crystal grains of an average size of about 500 Å was deposited with a thickness of 0.1 $\mu$m by reduced pressure CVD by thermally decomposing SiH$_4$ under a pressure of 0.3 Torr and with a substrate temperature of 620° C., and a SiO$_2$ layer of a thickness of 500 Å was formed by thermal oxidation. Then a polycrystalline Si layer of a thickness of 5,000 Å was again deposited by reduced pressure CVD similar to the foregoing one, and phosphor was added to said polycrystalline Si layer at a high concentration of 10$^{21}$ atoms/cm$^3$ by diffusion from phosphor glass (light absorbing layer).

The base member of the multi-layered structure thus formed was irradiated for 3 minutes from both sides by the light of tungsten halogen lamps with an intensity of 75 W/cm$^2$, in a N$_2$ atmosphere. The temperature, measured with an optical pyrometer on a temperature monitoring Si wafer reached 1,380° C. after irradiation for 3 minutes.

The thermal energy, generated by the light absorbed in the n$^+$polycrystalline Si layer of a thickness of 0.5 $\mu$m, was transferred by conduction, through said SiO$_2$ layer, to the undoped polycrystalline Si layer of the thickness of 0.1 $\mu$m, thereby heating said semiconductor layer. This heat treatment increased the grain size of said polycrystalline Si layer several hundred times up to 3 $\mu$m.

After the light irradiation, a field effect transistor was prepared in a similar manner as in Example 1, by an ordinary IC process, utilizing the light absorbing N$^+$polycrystalline Si layer as the gate, and there were obtained satisfactory characteristics.

What is claimed is:

1. A method for producing a semiconductor device comprising the steps of:
   (i) providing a substrate comprising sequentially a base plate, a semiconductor layer on said base plate, an insulating layer on said semiconductor layer, and a light absorbing layer on said insulating layer;
   (ii) irradiating said substrate with incoherent light for annealing said semiconductor layer wherein said base plate and said semiconductor layer comprise a material transmitting said incoherent light and said light absorbing layer comprises a material absorbing said incoherent light and generating thermal energy to indirectly anneal said semiconductor layer;
   (iii) subsequent to the step of irradiating, removing a portion of said light absorbing layer, thereby forming a gate electrode comprising the remaining portion of said light absorbing layer, and removing a portion of said insulating layer, thereby forming a gate insulating film comprising the remaining portion of said insulating layer; and
   (iv) forming a source region and a drain region.

2. A method according to claim 1, wherein said light absorbing layer is provided on and/or under said semiconductor layer with respect to said substrate.

3. A method according to claim 1, wherein a protective layer is formed on said light absorbing layer.

4. A method according to claim 1, wherein said semiconductor layer comprises a silicon containing semiconductor material.

5. A method according to claim 1, wherein said light absorbing layer comprises a semiconductive or metallic material.

6. A method according to claim 1, which comprises removing a part of said insulating layer by etching.

7. A method according to claim 1, which comprises effecting ion implantation into said semiconductor layer.

8. A method according to claim 1, wherein a part of the remaining portion of said insulating layer is said gate insulating film.

* * * * *

UNITED STATES PATENT AND TRADEMARK OFFICE
CERTIFICATE OF CORRECTION

PATENT NO. : 5,312,771
DATED : May 17, 1994
INVENTOR(S) : TAKAO YONEHARA

It is certified that error appears in the above-identified patent and that said Letters Patent is hereby corrected as shown below:

ON TITLE PAGE

In [56] References Cited, under U.S. PATENT DOCUMENTS: "Kusumoki et al." should read --Kusunoki et al.--.

In [56] References Cited, under FOREIGN PATENTD: "02162764  6/1990  Japan" should read --2-162764  6/1990  Japan--.

In [57] ABSTRACT, Line 5: "light" should read --light,--.

COLUMN 1

Line 46, "wafer" should read --wafer is--.

COLUMN 3

Line 18, "7,5000 µm" should read --7,500 µm--.

COLUMN 4

Line 28, "leaving" should read --elevating--.

COLUMN 5

Line 47, "SiO$^2$" should read --SiO$_2$--.
Line 63, "based" should read --base--.

COLUMN 6

Line 42, "sub threshold" should read --sub-threshold--.
Line 58, "layer 24" should read --layer 24.--.

UNITED STATES PATENT AND TRADEMARK OFFICE
CERTIFICATE OF CORRECTION

PATENT NO. : 5,312,771
DATED : May 17, 1994
INVENTOR(S) : TAKAO YONEHARA

It is certified that error appears in the above-identified patent and that said Letters Patent is hereby corrected as shown below:

COLUMN 7

Line 19, "gasses" should read --gases--.
Line 59, "sub threshold" should read --sub-threshold--.
Line 64, "sub" should read --sub- --.

COLUMN 8

TABLE 1, "Sub threshold" should read --Sub-threshold--.
Line 12, "sub threshold" should read --sub-threshold--.
Line 20, "$Si_3N_4$ layer," should read --$Si_3N_4$ layer 126,--.
Line 42, "500 µ" should read --500 Å--.
Line 44, "in" should read --an--.
Line 59, "SiH4" should read --$SiH_4$-- and "gasses" should read --gases--.

COLUMN 10

Line 51, "silicon containing" should read --silicon-containing--.

Signed and Sealed this

Eighth Day of November, 1994

Attest:

BRUCE LEHMAN

Attesting Officer          Commissioner of Patents and Trademarks